United States Patent [19]
Dent

[11] Patent Number: 5,918,169
[45] Date of Patent: Jun. 29, 1999

[54] HOMODYNE CELLULAR BASE STATION

[75] Inventor: Paul W. Dent, Pittsboro, N.C.

[73] Assignee: Ericsson, Inc., Research Triangle Park, N.C.

[21] Appl. No.: 08/719,788

[22] Filed: Sep. 25, 1996

[51] Int. Cl.[6] .................................. H04B 1/26
[52] U.S. Cl. ........................... 455/324; 455/561
[58] Field of Search .................... 455/324, 118, 455/130, 131, 511, 313, 255–257, 189.1, 190.1, 192.1, 561, 434, 455, 516, 517, 334, 552–553; H04B 1/22, 1/26; H04Q 7/36

[56] References Cited

U.S. PATENT DOCUMENTS

| | | | |
|---|---|---|---|
| 4,222,115 | 9/1980 | Cooper et al. | 375/1 |
| 4,736,390 | 4/1988 | Ward et al. | 455/315 |
| 4,866,787 | 9/1989 | Olesen | 455/6.1 |
| 5,073,971 | 12/1991 | Schaeffer | 455/447 |
| 5,159,710 | 10/1992 | Cusdin | 455/324 |
| 5,179,731 | 1/1993 | Trankle et al. | 455/324 |
| 5,241,702 | 8/1993 | Dent | 455/278.1 |
| 5,530,929 | 6/1996 | Lindquist et al. | 455/324 |
| 5,535,240 | 7/1996 | Carney et al. | 375/219 |
| 5,546,443 | 8/1996 | Raith | 455/450 |
| 5,579,306 | 11/1996 | Dent | 455/68 |
| 5,579,347 | 11/1996 | Lindquist et al. | 455/324 |

FOREIGN PATENT DOCUMENTS

WO 96/09733  3/1996  WIPO.

OTHER PUBLICATIONS

Leyonhjelm, Scott A. and Faulkner, Michael, Dr., "Digital Signal Processing and Direct Conversion for Multichannel Transmitters", IEEE Transactions on Communications, 1994.

*Primary Examiner*—Andrew I. Faile
*Assistant Examiner*—Vu Le
*Attorney, Agent, or Firm*—Jenkens & Gilchrist

[57] ABSTRACT

A method and apparatus for providing a homodyne cellular base station. A cellular antenna is coupled to both a conventional signal channel receiver a homodyne receiver. The conventional single channel receiver is configured to receive the control channel from a cellular band signal. The homodyne receiver utilizes a quadrature downconverter and local oscillator to receive the voice channels. The local oscillator is tuned to the frequency of the control channel to limit all DC offsets to the control channel within the homodyne receiver. All DC offsets and the control channel frequency are filtered from the homodyne receiver signal and, the filtered signal is then digitized and digitally processed to separate the signal into each of the traffic channels.

14 Claims, 3 Drawing Sheets

HOMODYNE CELLULAR BASE STATION

BACKGROUND OF THE INVENTION

1. Technical Field of the Invention

The present invention relates to cellular radio base stations, and more particularly to a cellular radio base station utilizing homodyne conversion of received cellular band signals to complex baseband signals.

2. Description of Related Art

Presently existing cellular radio base station require a great deal of expensive hardware for receiving both the control channel and the traffic channels utilized by cellular communications technology. The control channel carries signals controlling the cellular voice signals passing between the cellular radio base stations and mobile units. The traffic channels carry the voice transmission data between base stations and mobile units. The significant equipment cost associated with conventional receivers used in cellular radio base stations greatly increase the costs involved to users of cellular technology. A base station having significantly less hardware requirements and equipment costs will greatly benefit both the cellular service providers and customers paying for cellular services.

SUMMARY OF THE INVENTION

The present invention discloses a method and apparatus for providing a homodyne cellular base station that receives the control channel and each of the traffic channels of a cellular band signal using a homodyne receiver in conjunction with a single channel receiver. The base station includes an antenna for receiving cellular band signals and an associated filter and amplifier for processing received cellular band signals. Coupled to the antenna through a pair of buffers are a conventional single-channel receiver for receiving the control channel and a homodyne receiver for receiving the traffic channels.

The homodyne receiver consists of a quadrature downconverter for mixing the cellular band signal with a local oscillator signal to downconvert the cellular signal to an I, Q output signal. The local oscillator signal frequency corresponds to the control channel frequency of the cellular band signal. This enables all DC offsets within the I, Q output signal to reside only within the control channel. A high-pass filter removes any DC offset components and the control channel from the I, Q output signal of the quadrature downconverter. The remainder of the signal is then digitized using an analog to digital converter. The digital signal is next processed by a digital signal processor (DSP) and each of the traffic channels are extracted from the digitized signal using digital filtering.

The single channel receiver is configured to detect only the control channel of the cellular band signal since this channel is filtered from the signal processed by the homodyne receiver. Once detected, the control channel and the separated traffic channels are processed by the cellular base station as necessary.

BRIEF DESCRIPTION OF THE DRAWINGS

A more complete understanding of the method and apparatus of the present invention may be had by reference to the following Detailed Description when taken in conjunction with the accompanying Drawings wherein.

DETAILED DESCRIPTION OF THE DRAWINGS

Figure 1:
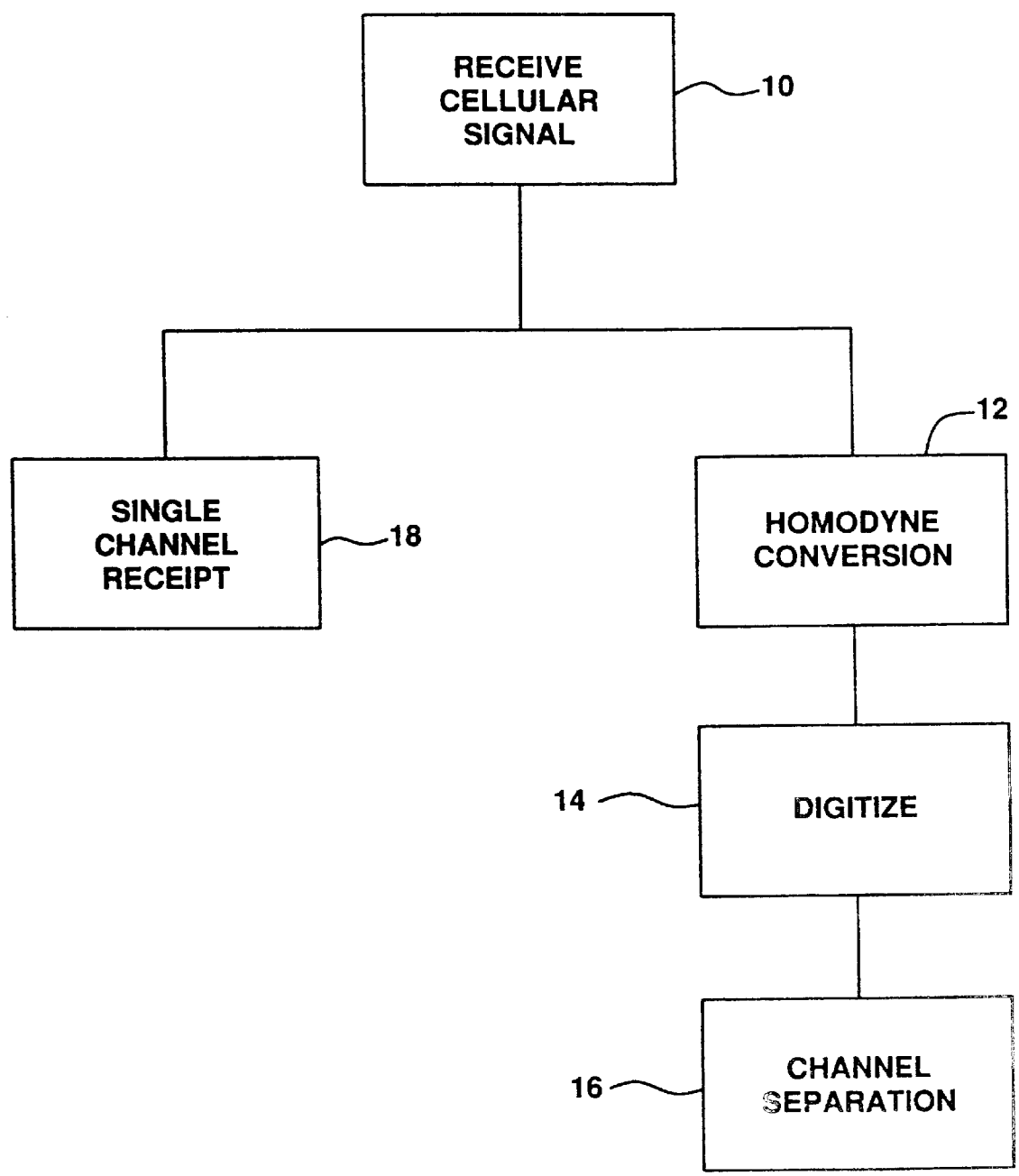
FIG. 1 is a block diagram illustrating the process performed by the homodyne cellular base station on the channels of a received cellular band signal.

Referring now to the drawings, and more particularly to FIG. 1, there is illustrated the process performed by the homodyne cellular base station on the channels of a cellular band signal. Initially, a cellular band signal is received at step 10 by the base station and processed by a pair of receivers. One of the receivers performs a homodyne conversion on the cellular band signal and converts at step 12 the signal to a complex baseband signal. The homodyne conversion of the cellular baseband signal will be more fully discussed in a moment with respect to FIG. 2.

The complex baseband signal is digitized at step 14 by a digital to analog converter and processed at step 16 by a digital signal processor. The digital signal processor performs channel separation of the converted baseband signal to extract each of the traffic channels in the received cellular band signal. The second receiver is a single channel receiver tuned to detect at step 18 the control channel in the cellular band signal.

Figure 2:
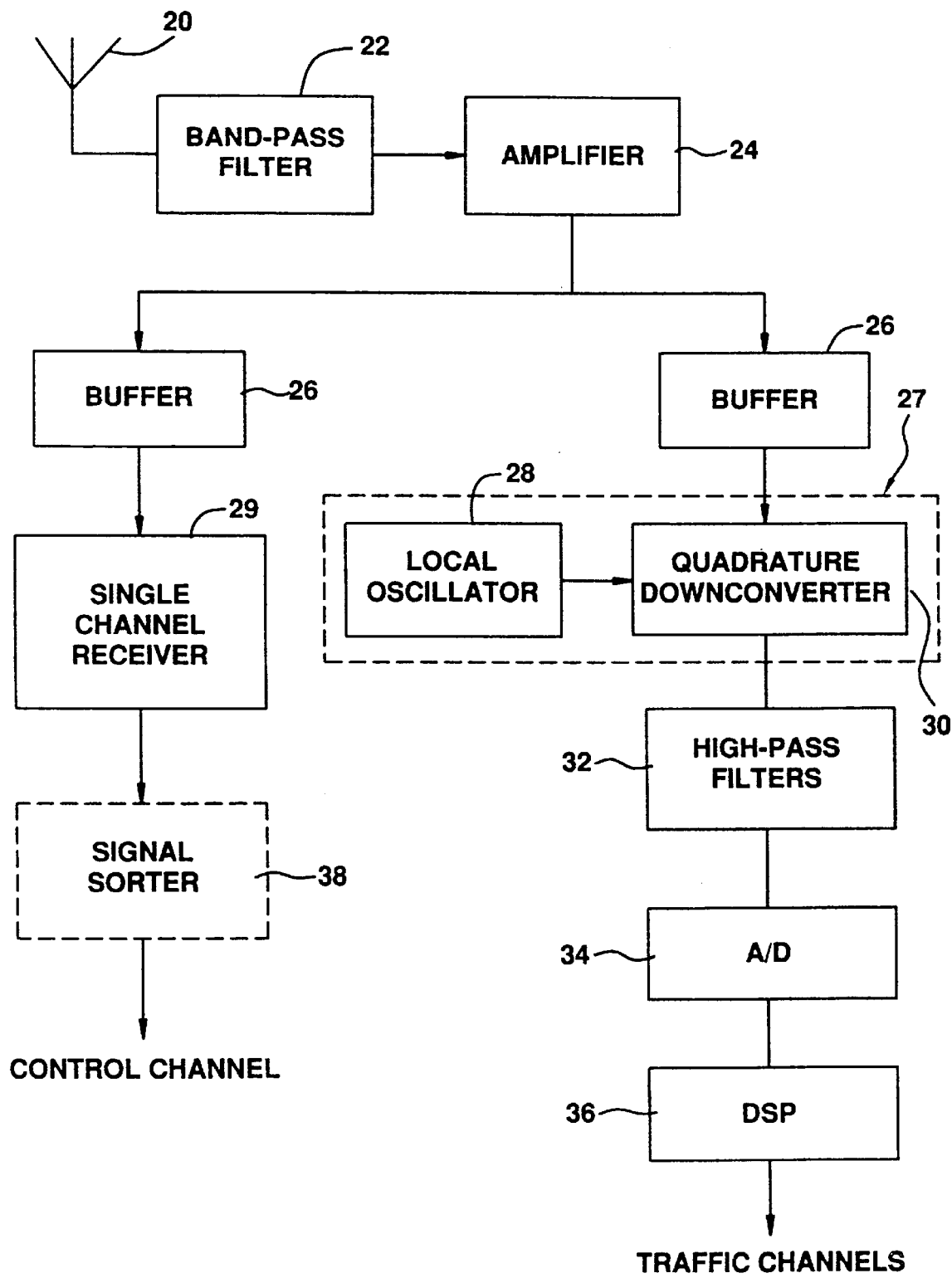
FIG. 2 is a block diagram of the homodyne cellular base station.

Referring now to FIG. 2, there is illustrated a block diagram of a cellular base station implementing the process discussed with respect to FIG. 1. The cellular base station has an antenna 20 for receiving cellular band signals from a plurality of mobile units (not shown). The received signals are passed through a band pass filter 22 to reject any signals other than the cellular band mobile unit signals. The filtered cellular signals are amplified via an amplifier 24 and then passed through a pair of buffers 26 to a homodyne receiver 27 and a single channel receiver 29. The buffers 26 limit the possibility of homodyne downconversion oscillator leakage interfering with the reception of the single channel receiver 29. In a preferred embodiment the buffers comprise high isolation buffer amplifiers and/or ferrite isolators coupled to the inputs of the homodyne receiver 27 and the single channel receiver 29.

A quadrature downconverter 28 (I, Q mixer) mixes the received cellular band signal with a local signal generated by a local oscillator 30 to downconvert the signal to a complex baseband I, Q signal. The downconverter 28 and local oscillator 30 comprise the homodyne receiver 27. The homodyne receiver 27 suffers from the well-known problem of DC offsets in the I, Q output signals of the downconverter 28, as described in U.S. Pat. No. 5,241,702 to applicant, which is hereby incorporated by reference herein. The DC offset within the I, Q output signals are of a larger magnitude than the received cellular signal components. Thus, the potential for losing or masking a desired portion of the cellular signal is present.

The problem of DC offsets is overcome according to this invention by setting the local oscillator 30 to the same frequency as the frequency of the control channel assigned to the cell in the cellular band. This is possible since the control channel is a fixed frequency channel. By setting the local oscillator frequency equal to the control channel frequency, the control channel maps to zero frequency or D.C. in the complex I, Q baseband and thus, the control channel is the only frequency channel interfered with by unwanted DC offsets from the quadrature conversion.

Since all of the traffic channels are displaced by at least one traffic channel bandwidth away from DC, the traffic channels are protected from interference by the DC offset. The traffic channels are further protected by filtering the signal from the quadrature downconverter 28 through a high-pass filter 32 to remove unwanted DC-offsets and control channel energy from the signal. High-pass filtering of the signal also prevents a momentary non-power controlled mobile unit from making a random access on the control channel and overloading the homodyne receiver 27.

The filtered I, Q outputs of the homodyne receiver 27 are digitized using an analog to digital converter 34. The digitized signal is then processed by a digital signal processor 36. The digital signal processor 36 performs channel separation on the digital signal to extract each of the voice channels from the digital signal using digital filtering functionalities encoded within the digital signal processor 36.

The control channel is received on a separate, conventional single channel receiver 29 tuned to the control channel frequency. The control channel and traffic channels are then processed by the cellular base station controller (not shown) to control cellular communications between the base station and mobile unit.

In a GSM system, the control channel occupies one TDMA time slot on a fixed frequency. Traffic signals occupy other time slots of the TDMA frame period, and may be frequency-hopped. The control channel receiver output in a GSM system is processed along with the output of the digitally separated traffic channels by a signal sorter 38 (shown in phantom) which re-assembles the frequency-hopped time slots of each traffic channel to reconstruct de-hopped signals for processing. This is known as "baseband frequency dehopping". When AMPS or IS54 (D-AMPS) systems are utilized, frequency-hopping is not present and no signal sorter 38 is required.

Figure 3:
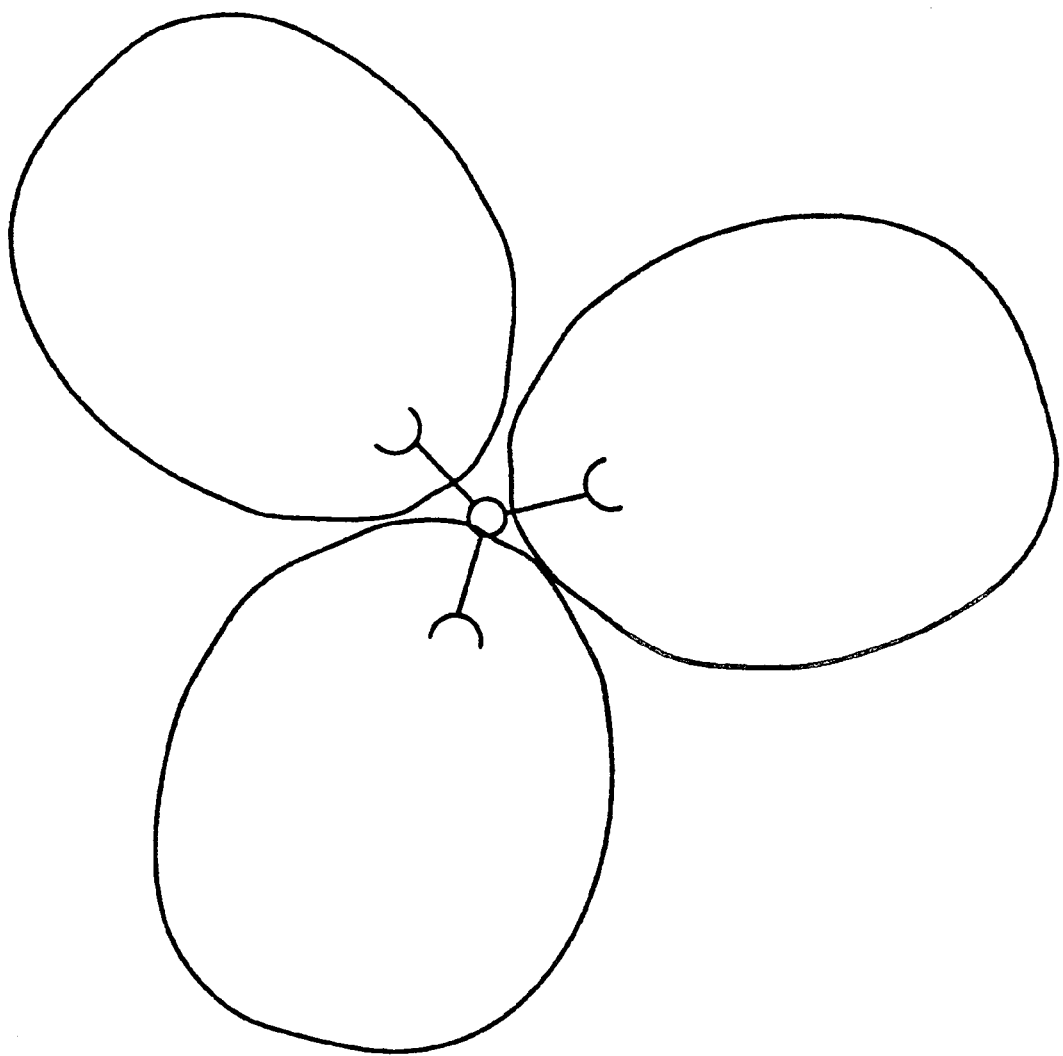
FIG. 3 illustrates a sectorized antenna configuration.

In an alternative embodiment of the present invention involving a sectorized system having 120-degree sector antennas within 3 cells (FIG. 3), the homodyne center frequency of the local oscillator of one sector is selected to be the calling channel of another sector such as that the isolation between different sector antennas provides additional isolation between the homodyne and the conventional receiver.

Alternately, the local oscillator frequency of a particular sector can be deliberately chosen to be equal to a control channel or traffic channel frequency assigned to another sector or to an adjacent base station, as that frequency will not be used in that particular sector.

Although an embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A cellular base station comprising:

means for receiving a cellular band signal;

a homodyne converter for converting the cellular band signal to a complex baseband signal, comprising:

a quadrature downconverter for mixing the cellular band signal with a local oscillator signal; and a local oscillator for generating the local oscillator signal, wherein the frequency of the generated local oscillator signal corresponds to a control channel frequency of the cellular band signal such that all DC offsets in the complex baseband signal are associated with the control channel frequency;

means for digitizing the complex baseband signal;

means for processing the digitized complex baseband signal to separate traffic channels from the baseband signal; and a single channel receiver for receiving a control channel within the cellular band signal.

2. The base station of claim 1 wherein the means for receiving further includes:

an antenna for receiving the cellular band signal;

a band pass filter for rejecting signals other than the cellular band signal, and an amplifier for amplifying the received cellular band signal.

3. The base station of claim 2, further including first and second buffers for coupling the means for performing a homodyne conversion and the single channel receiver to the antenna.

4. The base station of claim 1, further including a high-pass filter for removing the control channel from the complex baseband signal.

5. The base station of claim 1, further including signal sorting means for sequentially selecting said separated traffic channels according to a predetermined frequency-hopping sequence in order to reassemble frequency-hopped traffic signals.

6. A cellular radio base station comprising:

an antenna for receiving a cellular band signal;

a multi-channel homodyne receiver coupled to the antenna for converting the received cellular band signal to a complex baseband signal, the homodyne receiver performing homodyne downconversion of the received cellular band signal to a complex baseband signal such that a control channel frequency is an only frequency channel in the baseband signal affected by DC offsets;

means for digitally extracting traffic channels from the baseband signal; and a single channel receiver coupled to the antenna for receiving a control channel.

7. The base station of claim 6 wherein the homodyne receiver further includes:

a quadrature downconverter for mixing the cellular band signal with a local oscillator signal; and a local oscillator for generating the local oscillator signal, wherein a frequency of the generated local oscillator signal corresponds to a control channel frequency of the cellular band signal.

8. The base station of claim 7, further including a high-pass filter for removing the control channel frequency from the complex baseband signal.

9. The base station of claim 6, further including first and second buffers for coupling the homodyne receiver and the signal channel receiver to the antenna.

10. The base station of claim 6, further including a signal sorter for sequentially selecting outputs of said multi-channel receiver according to a predetermined frequency-hopping sequence in order to reassemble frequency-hopped traffic information.

11. A method for processing a cellular band signal containing voice channels and a control channel using a homodyne receiver comprising the steps of:

receiving a cellular band signal;

performing a homodyne conversion of the cellular band signal to a complex baseband signal such that all DC offset of the complex baseband signal reside within a frequency of the control channel;

extracting the voice channels from the converted complex baseband signal; and extracting the control channel from the received cellular band signal using a single channel receiver.

12. The method of claim 11 wherein the step of preforming a homodyne conversion further includes the steps of:

selecting a local oscillator signal having a frequency equivalent to the control channel frequency to ensure all DC offsets are within the control channel frequency; and mixing the local oscillator signal with the cellular band signal to generate the complex baseband signal.

13. The method of claim 11, further including the step of filtering the DC offset and control channel from the converted complex baseband signal.

14. The method of claim 11 wherein the step of extracting the voice channels further includes the steps of:

digitizing the complex baseband signal; and digitally filtering the complex baseband signal to separate the baseband signal into each of the voice channels.

* * * * *